(12) United States Patent
Cadouri

(10) Patent No.: US 7,334,205 B1
(45) Date of Patent: *Feb. 19, 2008

(54) OPTIMIZATION OF DIE PLACEMENT ON WAFERS

(75) Inventor: Eitan Cadouri, Cupertino, CA (US)

(73) Assignee: PDF Solutions, Inc., San Jose, CA (US)

(*) Notice: Subject to any disclaimer, the term of this patent is extended or adjusted under 35 U.S.C. 154(b) by 357 days.

This patent is subject to a terminal disclaimer.

(21) Appl. No.: 10/995,903

(22) Filed: Nov. 22, 2004

Related U.S. Application Data

(63) Continuation of application No. 10/428,747, filed on May 2, 2003, now Pat. No. 6,826,738.

(60) Provisional application No. 60/379,194, filed on May 10, 2002, now abandoned.

(51) Int. Cl.
*G06F 17/50* (2006.01)
*G06F 19/00* (2006.01)

(52) U.S. Cl. .................. 716/9; 716/10; 716/2; 700/97; 700/103; 700/121

(58) Field of Classification Search .............. 716/9, 716/10, 2; 700/97, 103, 121
See application file for complete search history.

(56) References Cited

U.S. PATENT DOCUMENTS

| | | | |
|---|---|---|---|
| 5,128,737 A * | 7/1992 | van der Have | 257/503 |
| 5,498,579 A | 3/1996 | Borodovsky et al. | |
| 5,874,189 A | 2/1999 | Stroh et al. | |
| 6,016,391 A * | 1/2000 | Facchini et al. | 716/21 |
| 6,070,004 A | 5/2000 | Prein | |
| 6,341,241 B1 | 1/2002 | Mugibayashi et al. | |
| 6,393,602 B1 | 5/2002 | Atchison et al. | |
| 6,442,731 B2 * | 8/2002 | Doi | 716/1 |
| 6,591,409 B2 | 7/2003 | Kamath et al. | |
| 6,604,233 B1 * | 8/2003 | Vickery et al. | 716/19 |
| 6,703,170 B1 | 3/2004 | Pindo | |
| 6,826,738 B2 | 11/2004 | Cadouri | |
| 7,062,346 B2 * | 6/2006 | Takagi et al. | 700/116 |
| 7,155,689 B2 * | 12/2006 | Pierrat et al. | 716/4 |
| 7,174,521 B2 * | 2/2007 | Stine et al. | 716/4 |
| 2002/0004928 A1 * | 1/2002 | Doi | 716/8 |

(Continued)

FOREIGN PATENT DOCUMENTS

| | | |
|---|---|---|
| EP | 854430 A2 * | 7/1998 |
| WO | WO-03/096234 A2 | 11/2003 |
| WO | WO-03/096234 A3 | 11/2003 |

OTHER PUBLICATIONS

Ouyang et al., "Maximizing Wafer Productivity Through Layout Optimization", 13th International Conference on VLSI Design, Jan. 3-7, 2000, pp. 192-197.*

(Continued)

*Primary Examiner*—Phallaka Kik
(74) *Attorney, Agent, or Firm*—Morrison & Foerster LLP

(57) ABSTRACT

A method of optimizing production of semiconductor devices on a wafer comprises steps of characterizing at least one effect of at least one manufacturing component on at least one optimization criterion; inputting user optimization data; and, based on the at least one effect and the user optimization data, performing optimization to determine a layout of semiconductor devices on the wafer that optimizes performance according to the user optimization data.

20 Claims, 1 Drawing Sheet

U.S. PATENT DOCUMENTS

2002/0123818 A1    9/2002  Yamada et al.
2003/0033581 A1*   2/2003  Mukai ............................ 716/2
2003/0054642 A1*   3/2003  Kagotani et al. ........... 438/689
2003/0192025 A1*  10/2003  Liu .............................. 716/19

OTHER PUBLICATIONS

Maynard et al., "Modeling and Optimization of Wafer Radial Yield", 1999 IEEE/SEMI Advanced Semiconductor Manufacturing Conference, Sep. 8-10, 1999, pp. 71-75.*

Lee et al., "The Optimization of In-Line Scanner Defect Sizing Uisng a Circuit's Layout and Critical Area", 1997 IEEE/SEMI Advanced Semiconductor Manufacturing Conference, 101-12 Sep. 1997, pp. 78-83.*

Baxter et al., "Using Defect Density Modelling to Drive the Optimization of Circuit Layout", 1995 IEEE International Workshop on Defect and Fault Tolerance in VLSI Systems, Nov. 13-15, 1993, pp. 164-172.*

Mozunder et al., "Statistical Control of VLSI Fabrication", IEEE/CHMT '90 IEMT Symposium, Oct. 1-3, 1990, pp. 174-183.*

Gasser, R.A. (Dec. 2, 2001). "Yield Learning and Volume Manufacturing of High Performance Logic Technologies on 200mm and 300mm Wafers," *International Electron Devices Meeting*, Washington, DC, Dec. 2-5, pp. 28.1.1-28.1.4.

International Search Report issued for PCT Patent Application No. PCT/US03/14613 mailed Oct. 10, 2003, three pages.

Sarma et al. (Oct. 20, 1996). "Wafer Level Reliability Application to Manufacturing of High Performance Microprocessor," *IEEE International Integrated Reliability Workshop*, Oct. 20, 1996, pp. 77-81.

* cited by examiner

OPTIMIZATION OF DIE PLACEMENT ON WAFERS

CROSS-REFERENCE TO RELATED APPLICATIONS

This application is a continuation of U.S. patent application Ser. No. 10/428,747, filed on May 2, 2003, which issued as U.S. Pat. No. 6,826,738, which claims the benefit of U.S. Provisional Patent Application No. 60/379,194, filed on May 10, 2002 now abandoned, both of which are incorporated by reference herein.

BACKGROUND OF THE INVENTION

1. Field of the Invention

This invention relates generally to the field of manufacturing of semiconductor devices, and more specifically to a process to print fields on a wafer in a way that increases the semiconductor manufacturer (FAB) throughput, profitability and/or product reliability.

2. Background Art

The annual sales of the semiconductor industry are around $152,000,000,000 to $200,000,000,000 a year. New semiconductor manufacturing plants (FABs) cost from $2 billion to more than $10 billion. Large increases in fabrication cost are primarily driven by an increase in equipment costs. Algorithms that increase a FAB's productivity and/or profitability, even by a small percentage, will reduce the cost of a die and will significantly increases the profitability of the semiconductor company.

Today the following model is typically used to calculate the cost of a die:

$$C_{die} = C_{wafer} / (N_{dies\ on\ a\ wafer} * Y_{wafer})$$

where:

$C_{die}$ is the cost of a die;

$C_{wafer}$ is the cost to manufacture a wafer;

$N_{dies\ on\ a\ wafer}$ is the number of dies on a wafer; and $Y_{wafer}$ is the wafer yield.

Prior approaches to laying out dies on a wafer typically assume uniform manufacturing cost for placing reticles on the wafer. The objective for the prior optimization algorithm is to reduce the manufacturing cost by reducing the number of reticle fields and increasing the number of gross dies. Furthermore, new process technologies require that fields be printed on a wafer, even if they will not produce any good-yielding dies. Prior art optimization techniques, for example, as disclosed in U.S. Pat. Nos. 5,874,189 and 6,016,391, will eliminate the reticle fields that do not produce good-yielding dies. However, by doing so they will reduce the yield of the dies placed on the wafer. Furthermore, the prior approaches assume uniformity of yield and product performance across the wafer and uniformity in the manufacturing cost. As a result, they may increase the number of dies placed on the wafer, but the total dies shipped to the customers will be reduced. Using the prior approaches will thus cause loss in yield, product reliability, FAB throughput and FAB profitability.

SUMMARY OF THE INVENTION

One object of the present invention is to print fields on the wafer in a way that maximizes the number of dies shipped to customers, the FAB throughput and profitability.

Another object of the invention is place fields on the wafer in a way that maximizes the product reliability produced by the FAB.

A further object of the invention is to define the die shape and the reticle shape to maximize product reliability, FAB profitability and productivity.

Other objects and advantages of the present invention will become apparent from the description below, taken in connection with the accompanying drawings, wherein, by way of illustration and example, embodiments of the present invention are disclosed.

One embodiment of the invention comprises a method of optimizing production of semiconductor devices from a wafer, comprising the following steps. At least one effect on at least one aspect of production (e.g., yield, cost, profitability, etc.) due to at least one manufacturing component (where a manufacturing component is defined to be a process or machine used in the manufacture of semiconductor devices on the wafer) is determined. A user inputs data corresponding to at least one optimization target. Then, optimization is performed based on the determined effect(s) and the data input by the user to determine a layout of semiconductor devices on the wafer.

In further embodiments, the inventive method may be embodied in the form of software on a computer-readable medium or in the form of a computer system running such software.

In one preferred embodiment of the invention, the process determines layout of fields on a wafer in a way that increases the semiconductor manufacturer (FAB) throughput, profitability and product reliability. The process may include a process to base the placement on non-uniformity of the yield and product performance distribution across the wafer, a process to base the placement on non-uniformity of cost associated with the production of each die on the wafer, and/or a process to base the placement on non-uniformity of the selling price of different dies placed on the wafer. Product reliability may also be integrated into the placement optimization process.

In a further preferred embodiment of the invention, the inventive process may comprise steps of defining shapes and/or aspect ratios of dies and/or reticles in a way that increases the semiconductor manufacturer (FAB) throughput, profitability and product reliability.

The process may include placing semiconductor chips (dies) on the wafer, determining the die aspect ratio, determining the chips' shapes, defining design rules, and/or aligning the FAB equipment and FAB manufacturing environment.

Definitions

In describing the invention, the following definitions are applicable throughout (including above).

A "computer" refers to any apparatus that is capable of accepting a structured input, processing the structured input according to prescribed rules, and producing results of the processing as output. Examples of a computer include: a computer; a general purpose computer; a supercomputer; a mainframe; a super mini-computer; a mini-computer; a workstation; a microcomputer; a server; an interactive television; a hybrid combination of a computer and an interactive television; and application-specific hardware to emulate a computer and/or software. A computer can have a single processor or multiple processors, which can operate in parallel and/or not in parallel. A computer also refers to two or more computers connected together via a network for transmitting or receiving information between the computers. An example of such a computer includes a distributed computer system for processing information via computers linked by a network.

A "computer-readable medium" refers to any storage device used for storing data accessible by a computer. Examples of a computer-readable medium include: a magnetic hard disk; a floppy disk; an optical disk, like a CD-ROM or a DVD; a magnetic tape; a memory chip; and a carrier wave used to carry computer-readable electronic data, such as those used in transmitting and receiving e-mail or in accessing a network.

"Software" refers to prescribed rules to operate a computer. Examples of software include: software, code segments; instructions; computer programs; and programmed logic.

A "computer system" refers to a system having a computer, where the computer comprises a computer-readable medium embodying software to operate the computer.

A "network" refers to a number of computers and associated devices that are connected by communication facilities. A network involves permanent connections such as cables or temporary connections such as those made through telephone or other communication links. Examples of a network include: an internet, such as the Internet; an intranet; a local area network (LAN); a wide area network (WAN); and a combination of networks, such as an internet and an intranet.

BRIEF DESCRIPTION OF THE DRAWINGS

The features of the present invention and the manner of attaining them will become apparent, and the invention itself will be understood, by reference to the following description and the accompanying drawing, wherein.

DETAILED DESCRIPTION OF PREFERRED EMBODIMENTS OF THE INVENTION

Figure 1:
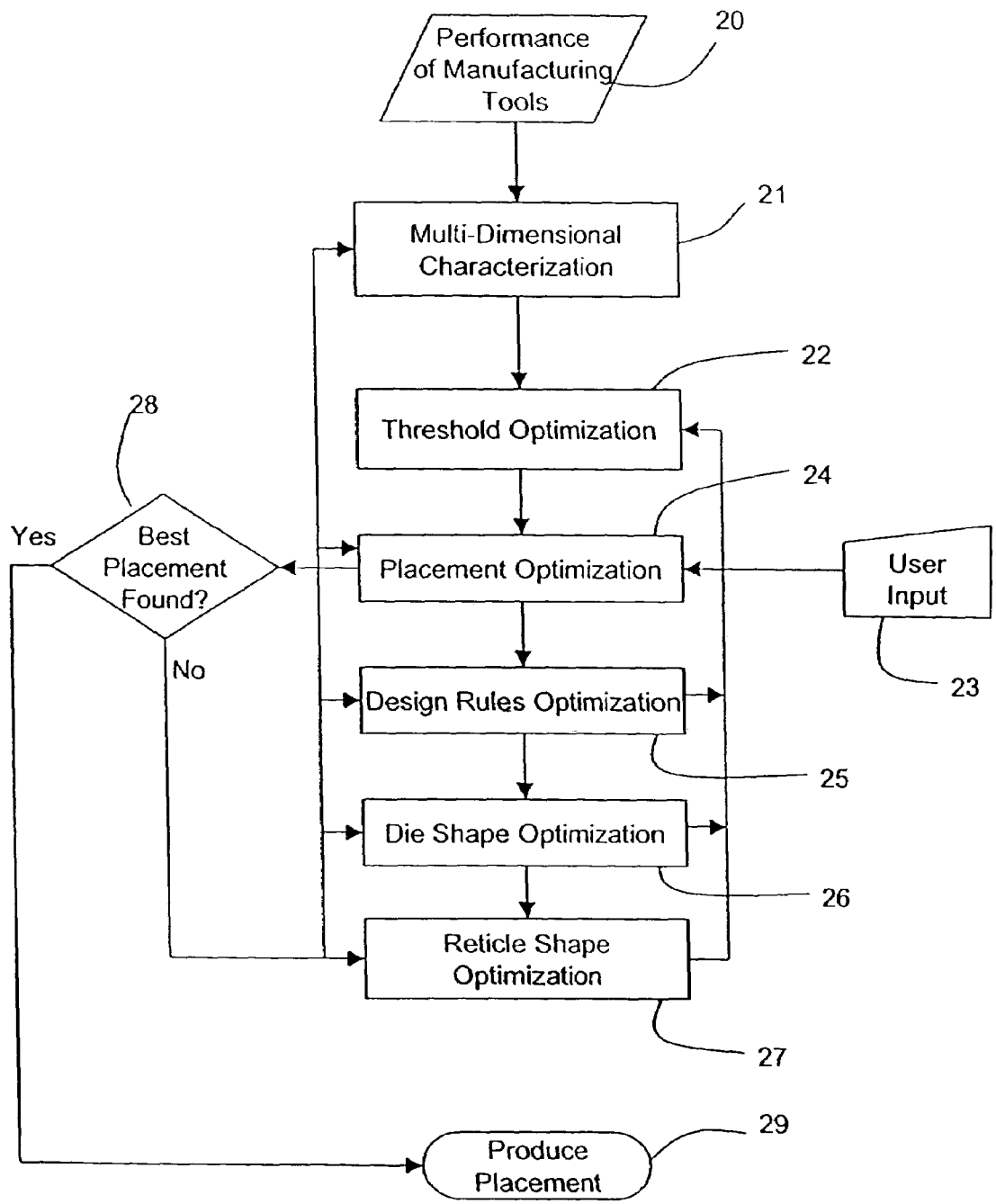
FIG. 1 is a flow chart depicting a method according to an embodiment of the invention.

Detailed descriptions of preferred embodiments of the invention are provided herein. It is to be understood, however, that the present invention may be embodied in various forms. Therefore, specific details disclosed herein are not to be interpreted as limiting, but rather as a basis for the claims below and as a representative basis for teaching one skilled in the art to employ the present invention, in virtually any appropriately detailed system, structure or manner.

FIG. 1 shows a flow chart depicting an embodiment of the inventive process. The process begins in Step (20) with characterization of manufacturing tools. Such manufacturing tools include any or all processes and equipment used on a particular wafer of interest. In particular, Step (20) may involve characterizing different FAB equipment and processes in terms of their impact on, for example, yield, product performance, throughput, manufacturing and test, defect density analysis results, and reliability. This may be done, for example, using statistical data from existing products produced by the FAB. However, there are other methods known in the art for performing such characterizations.

For example, consider the use of clamps during the manufacturing process. Such clamps are typically used to hold the wafer in the manufacturing equipment. In an area in which a clamp physically holds the wafer, the yield would be zero. This would be a characterization of the effects of the clamp on yield. The idea of the present invention, in this simple example, is that if one places dies on the wafer, given knowledge of clamp placement, one may be able to optimize yield, given the clamp placement. This might be accomplished, for example, by avoiding placing dies where a clamp is located and/or where dies would partially overlap with the position of a clamp.

Next, in Step (21), multi-dimensional analysis data is created and stored, to be used in subsequent optimization steps. Such multi-dimensional analysis data may include, for example, a detailed description of the non-uniformity of the yield across the wafer and/or the non-uniformity of the manufacturing process. It may further include the impact of the non-uniformity of the manufacturing process on the performance of the dies manufactured. As a result, the non-uniformity of the selling price of dies can also be computed. The data is related to the FAB, a specific process in the FAB, a type of product or a particular die in the FAB. Step (21) may further include analyzing different patterns of die placement configuration and their effects on, for example, yield.

Continuing with the example of the clamp(s) above, such multi-dimensional analysis data could be a determination of yield as a function of location on the wafer.

This example, demonstrates the use of yield as a function of wafer location. However, in general, other quantities may be determined, for example, cost or quality as a function of location on the wafer.

In Step (22), a yield threshold number, or range of such numbers, may be determined. Yield threshold number refers to a desired yield probability. An increase in the yield threshold number increases product reliability on one hand; on the other hand, it might increase the manufacturing cost and also may have a negative impact on productivity and FAB profitability. A yield threshold number (or range) is either entered by a user (in Step (23)), or is calculated in Step (22) based on parameters input by the user. The yield threshold number is used in subsequent steps of optimizing the placement of fields on a wafer.

In Step (23), the user provides various parameters with regard to the product (chip) in production. Such parameters may include product information, actual cost associated with the manufacturing of the die, die selling price and different optimization objectives, which may include, but are not limited to, yield, throughput, reliability, and profitability. The user-entered parameters may include a yield threshold number (or range), as discussed above.

Step (24) represents an optimization stage that simultaneously optimizes for the different optimization targets set by the user. If the best optimization objectives are met, as tested in Step (28), then the placement information corresponding to the best placements will be produced in Step (29). The optimization is based on the analysis data derived in Step (21), as well as on the user-entered parameters from Step (23). The simultaneous optimization may be performed, for example, using genetic algorithms, neural networks, or simulated annealing.

The test of Step (28) determines whether the previous optimization results and the present optimization results are within some tolerance(s) of each other (that is, when they are the "same," to within some predetermined amount). The type and size of each tolerance is generally based on the types of optimization targets and may also be based on the user's preferences. Step (28) is discussed further below.

What constitutes "best placement" will generally depend on the user-entered optimization targets. The following are examples of some of the quantities that may be optimized to determined "best placement:"

Gross dies per wafer: The best placement under this criterion would be that placement resulting in the greatest number of dies placed on the wafer.

Wafer yield: As discussed above, different dies placed at different locations of the wafer may have different probabilities of yielding good (operative, or acceptable according to some criterion) chips. Under this criterion, best placement can be defined as one that maximizes the totals dies' yield, expressed as $$W_{Yield} = \sum D_{Yield},$$

where $D_{Yield}$ represents the yield probability of a particular die on the wafer and $W_{Yield}$ represents the sum of the yield probabilities over all dies on the wafer whose yields are above the threshold number. This may also be referred to as "sum-yield" or "σ-yield."

Wafer value: It is possible for different dies placed at different locations on the wafer to have different performances and, therefore, different values. For example, a microprocessor chip produced in one portion of the wafer may be reliably used at a 2.5 MHz clock rate, whereas a similar chip produced in a different portion of the wafer, where the quality/performance is less reliable, may be reliably clocked only at 1.25 MHz. Mathematically, this may be stated as $$W_{Value} = \sum D_{Value},$$

where $D_{Value}$ represents the value of a particular die on the wafer and $W_{Value}$ represents the sum of the values over all dies on the wafer.

Yield potential: This criterion looks at the expected return for a wafer, based both on yield and value of the products produced. For example, a die located in one portion of the wafer may be reliable at 1.5 MHz (and thus have a relatively higher value) with a yield of 50% (good chips), while a die located in another portion of the wafer may be reliable at 1.2 MHz (and thus have a relatively lower value) but have a 70% yield. Yield potential is defined as the sum of the products of value and yield, over all the dies on the wafer. Mathematically, this may be expressed as $$W_{YieldValue} = \sum D_{YieldValue},$$

where $D_{YieldValue}$ represents the product $D_{Yield}*D_{Value}$ for a particular die on the wafer and $W_{YieldValue}$ represents the yield potential and is the sum of $D_{YieldValue}$ over all dies on the wafer. $D_{Yield}$ and $D_{Value}$ are as previously defined.

Manufacturing cost: The criterion here is the total manufacturing cost of a wafer. This may be expressed as $W_{Mcost}=W_{Constant}+GC_{Mcost}+BD_{Mcost}$. In this equation, $W_{Constant}$ represents the fixed costs of manufacturing a wafer, including raw material and machine time for handling the wafer. $GD_{Mcost}$ represents the total cost to manufacture and test good dies. Finally, $BD_{Mcost}$ represents the total cost to manufacture and test bad dies (bad dies include all areas of the wafer that were partially flashed during manufacture).

Productivity of gross dies: Here, the criterion is the productivity FAB based on the average cost to manufacture a die on the wafer. This can be expressed mathematically as $P_{Gross}=W_{Mcost}/N_{Gross}$, where $P_{Gross}$ represents the productivity of gross dies, $W_{Mcost}$ represents the manufacturing cost, defined above, and $N_{Gross}$ represents the gross number of dies produced.

Productivity of yield dies: This refers to the productivity of a FAB based on the average cost of manufacturing a good die on a wafer. This can be expressed mathematically as $P_{Yielded}=W_{Mcost}/N_{Good}$, where $P_{Yielded}$ represents the productivity of yielded dies, $W_{Mcost}$ represents the manufacturing cost, defined above, and $N_{Good}$ represents the sum yield of dies with yield probability above threshold produced.

Return on investment (ROI) yield: This criterion represents the ROI of manufacturing a die and may be expressed as $ROI_{Yield}=W_{Value}/W_{Mcost}$, where all quantities, except the left side of the equation (which is the ROI yield) have been defined above.

ROI Yield Value: This is similar to ROI yield but is based, instead, on yield potential ($W_{YieldValue}$), defined above. In particular, ROI YieldValue is defined as $ROI_{YieldValue}=W_{YieldValue}/W_{Mcost}$.

Step (25) involves changing the design rules, which step might take place, for example, to increase the sum-yield or other optimization criterion, and also the die shape, size aspect ratio and layout (Step (26)). This implies that the size, shape, aspect ratio, and layout of the field may be redesigned (Step (27)) in the process of optimization. In such cases, non-uniformity of fields printed on the wafer must be recomputed, and design and implementation may change, i.e., printing the same device in a different location on the wafer may require using a different field design.

The optimization steps, Steps (25)-(27), may, in a preferred embodiment of the invention, involve the use of simulation in order to determine optimal layout characteristics. Ideally, this simulation is integrated with the rest of the method and appears seamless to the user. That is, the results of the previous steps are fed into a simulation portion of the method, and the simulation portion simulates the results over different design rules, shapes, etc.

Following the optimization in Steps (25)-(27), the process loops back to Step (22), the threshold optimization step, and to Step (24), the placement optimization step. Such looping back may occur after any one of Steps (25)-(27), as desired. For example, there may be criteria set at the end of Steps (25) and (26) that, if met, allow the process to loop back, and if not met, require the process to go on to the following step. Such criteria address how well optimized the layout has become as a result of the particular optimization step. The determination of such criteria are left as a design decision for the system designer.

In Step (28), optimization results are quantified and stored. Next, when new placement results are computed, the process will determine if the best results were found or if the optimization has reached a point where they can not be further optimized. As discussed above, this is done in terms of a tolerance. Should this be the case, the optimization process will stop, and the process will produce the placement in Step (29). It is possible to have different solutions that meet the objectives set by the user, and redundancy elimination is an essential part of this process.

If the best solution (i.e., within some tolerance) has not been found, the process loops back. This looping back, as shown in FIG. 1, may be to any of Steps (21) and (24)-(27). In general, the process designer may either set a particular step to which the process will loop or may establish one or more criteria, as part of Step (28), by which it is determined to which step the process will loop. The one or more criteria will address how "close" the current placement is to being optimized and, as some of the steps result in coarser and some in finer adjustments to the placement, will determine to which step the process will loop.

Step (29) produces placement information, once the optimization process is complete. The information produced will set up the FAB environment so as to create the optimized solution. In general, the output will include files containing at least data and/or programs that will optimize a stepper and a tester/programmer. Such data may also include information like optimal clamp location.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

I claim:

1. A method of optimizing layout of semiconductor devices on a wafer, comprising:
   obtaining at least one effect on at least one aspect of production of the semiconductor devices on the after due to at least one manufacturing component, wherein at least one manufacturing component is a process or machine used in the production of the semiconductor devices on the wafer;
   obtaining user input data corresponding to at least one optimization target; and
   performing an optimization based on the at least one effect and the user input data to determine a layout of the semiconductor devices on the wafer, wherein performing the optimization includes analyzing different patterns for placing the semiconductor devices on the wafer.

2. The method of claim 1, wherein obtaining at least one effect includes:
   characterizing the effect of at least one manufacturing component on yield.

3. The method of claim 2, wherein the at least one manufacturing component is a clamp.

4. The method of claim 1, wherein obtaining at least one effect includes:
   characterizing an effect of at least one manufacturing component on yield, product performance, throughput, manufacturing and test, defect density analysis results, and reliability.

5. The method of claim 1, further comprising:
   creating multi-dimensional data analysis that includes a description of non-uniformity of yield access a wafer or non-uniformity of a manufacturing process; and
   storing the multi-dimensional data analysis.

6. The method of claim 5, further comprising:
   using the stored multi-dimensional data analysis in a subsequent optimization to determine a layout of the semiconductor devices on the wafer.

7. The method of claim 5, wherein the multi-dimensional data analysis includes impact of non-uniformity of the manufacturing process on performance of the semiconductor devices.

8. The method of claim 1, further comprising:
   obtaining a yield threshold number, wherein an increase in the yield threshold number corresponds to an increase in product reliability.

9. The method of claim 8, wherein the yield threshold number is entered by a user or calculated based on user input data.

10. The method of claim 1, wherein user input data includes product information, actual cost associate with manufacturing the semiconductor devices, selling price for the semiconductor devices, and different optimization objectives.

11. The method of claim 1, wherein the different optimization objectives include yield, throughput, reliability, and profitability.

12. The method of claim 1, wherein performing an optimization includes:
    determining if a best placement has been found.

13. The method of claim 12, wherein determining if a best placement has been found includes optimizing one or more of: gross dies per wafer, wafer yield, wafer value, yield potential, manufacturing cost, productivity of gross dies, productivity of yielded dies, return on investment yield, and return on investment yield values.

14. The method of claim 1, wherein performing on optimization includes:
    changing design rules.

15. The method of claim 1, wherein performing an optimization includes:
    changing one or more of: die shape, size, aspect ratio, and layout.

16. The method of claim 1, wherein performing an optimization includes;
    changing one or more of: reticle field shape, size, aspect ratio, and layout.

17. A method of optimizing layout of semiconductor devices on a wafer, comprising:
    creating multi-dimensional data analysis that includes a description of non-uniformity of yield across a wafer or non-uniformity of a manufacturing process;
    storing the multi-dimensional data analysis; and
    obtaining user input data corresponding to at least one optimization target; and
    performing an optimization based on the stored multi-dimensional data analysis and the user input data to determine a layout of the semiconductor device on the wafer, wherein performing the optimization includes analyzing different patterns for placing the semiconductor devices on the wafer.

18. A computer-readable medium having computer executable instructions that when executed by a computer, causes the computer to optimize layout of semiconductor devices on a wafer, the instructions comprising:
    obtaining at least one effect on at least one aspect of production of the semiconductor devices on the wafer due to at least one manufacturing component, wherein the at least one manufacturing component is a process or machine used in the production of the semiconductor devices on the wafer;
    obtaining user input data corresponding to at least one optimization target; and
    performing an optimization based on the at least one effect and the user input data to determine a layout of the semiconductor devices on the wafer, wherein performing the optimization includes analyzing different patterns for placing the semiconductor devices on the wafer.

19. The computer-readable medium of claim 18, further comprising instructions for:
    creating multi-dimensional data analysis that includes a description of non-uniformity of yield across a wafer or non-uniformity of a manufacturing process; and
    storing the multi-dimensional data analysis.

20. The computer-readable medium of claim 18, wherein performing an optimization includes one or more of:
    changing design rules;
    changing one or more of: die shape, size, aspect ratio, and layout; and
    changing one or more of: reticle field shape, size, aspect ratio, and layout.

* * * * *